(12) United States Patent
Cui et al.

(10) Patent No.: US 10,007,184 B2
(45) Date of Patent: Jun. 26, 2018

(54) SILICON-CONTAINING UNDERLAYERS

(71) Applicant: Rohm and Haas Electronic Materials LLC, Marlborough, MA (US)

(72) Inventors: Li Cui, Westborough, MA (US); Charlotte A. Cutler, Bellingham, MA (US); Suzanne M. Coley, Mansfield, MA (US); Owendi Ongayi, Tarragona (ES); Christopher P. Sullivan, Lakeville, MA (US); Paul J. LaBeaume, Auburn, MA (US); Shintaro Yamada, Shrewsbury, MA (US); Mingqi Li, Shrewsbury, MA (US); James F. Cameron, Brookline, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days. days.

(21) Appl. No.: 15/254,929

(22) Filed: Sep. 1, 2016

(65) Prior Publication Data

US 2018/0059546 A1    Mar. 1, 2018

(51) Int. Cl.
| | | |
|---|---|---|
| *G03F 7/42* | (2006.01) | |
| *G03F 7/11* | (2006.01) | |
| *G03F 7/16* | (2006.01) | |
| *G03F 7/20* | (2006.01) | |
| *G03F 7/30* | (2006.01) | |
| *C08F 16/10* | (2006.01) | |
| *C08F 24/00* | (2006.01) | |
| *C08G 77/04* | (2006.01) | |
| *C09D 5/20* | (2006.01) | |
| *C09D 183/04* | (2006.01) | |
| *C08G 63/08* | (2006.01) | |
| *C08F 20/14* | (2006.01) | |
| *C08F 20/30* | (2006.01) | |
| *C08F 20/06* | (2006.01) | |

(52) U.S. Cl.
CPC ............... *G03F 7/11* (2013.01); *C08F 16/10* (2013.01); *C08F 20/06* (2013.01); *C08F 20/14* (2013.01); *C08F 20/30* (2013.01); *C08F 24/00* (2013.01); *C08G 63/08* (2013.01); *C08G 77/04* (2013.01); *C09D 5/20* (2013.01); *C09D 183/04* (2013.01); *G03F 7/161* (2013.01); *G03F 7/20* (2013.01); *G03F 7/30* (2013.01); *G03F 7/422* (2013.01); *C08F 2800/10* (2013.01)

(58) Field of Classification Search
None
See application file for complete search history.

(56) References Cited

U.S. PATENT DOCUMENTS

| | | | | |
|---|---|---|---|---|
| 4,169,068 | A * | 9/1979 | Harita | C11D 3/3947 134/3 |
| 5,904,546 | A * | 5/1999 | Wood | H01L 21/78 257/E21.599 |
| 6,277,752 | B1 * | 8/2001 | Chen | H01L 21/3081 257/E21.232 |
| 7,514,199 | B2 | 4/2009 | Uh et al. | |
| 7,605,439 | B2 | 10/2009 | Gronbeck et al. | |
| 7,955,782 | B2 | 6/2011 | Mukhopadhyay et al. | |
| 8,029,974 | B2 | 10/2011 | Ogihara et al. | |
| 8,815,494 | B2 | 8/2014 | Shibayama et al. | |
| 8,828,879 | B2 | 9/2014 | Kanno et al. | |
| 8,835,093 | B2 | 9/2014 | Shibayama et al. | |
| 8,852,844 | B2 | 10/2014 | Ogihara et al. | |
| 8,932,953 | B2 | 1/2015 | Ogihara et al. | |
| 9,442,377 | B1 * | 9/2016 | Ongayi | G03F 7/091 |
| 2003/0129531 | A1 * | 7/2003 | Oberlander | G03F 7/0392 430/271.1 |
| 2004/0110896 | A1 | 6/2004 | Yoshioka et al. | |
| 2008/0213701 | A1 | 9/2008 | Kim et al. | |
| 2010/0255427 | A1 | 10/2010 | Wang et al. | |
| 2010/0291483 | A1 * | 11/2010 | Hamada | G03F 7/091 430/282.1 |
| 2011/0207047 | A1 * | 8/2011 | Burns | G03F 7/0752 430/270.1 |
| 2012/0070994 | A1 | 3/2012 | Kanno et al. | |
| 2013/0005150 | A1 | 1/2013 | Ogihara et al. | |
| 2013/0337168 | A1 * | 12/2013 | Yoshihara | H01L 21/02304 427/240 |
| 2014/0186774 | A1 | 7/2014 | Glodde et al. | |
| 2014/0273501 | A1 | 9/2014 | Glodde et al. | |
| 2016/0064220 | A1 * | 3/2016 | Ogihara | H01L 21/31116 438/514 |
| 2016/0096977 | A1 | 4/2016 | Tachibana et al. | |
| 2016/0363861 | A1 * | 12/2016 | Ongayi | G03F 7/091 |
| 2017/0003595 | A1 * | 1/2017 | Aoki | C08G 8/20 |

FOREIGN PATENT DOCUMENTS

| | | | |
|---|---|---|---|
| JP | 2007-086528 | * 4/2007 | |
| JP | 2007-199653 | * 8/2007 | ............... G03F 7/11 |
| JP | 2013210558 A | 10/2013 | |
| WO | 2015146523 | * 1/2015 | |

* cited by examiner

*Primary Examiner* — Martin J Angebranndt
(74) *Attorney, Agent, or Firm* — S. Matthew Cairns

(57) ABSTRACT

Wet-strippable underlayer compositions comprising one or more silicon-containing polymers comprising a backbone comprising Si—O linkages, one or more organic blend polymers, and a cure catalyst are provided. These compositions are useful in the manufacture of various electronic devices.

10 Claims, No Drawings

SILICON-CONTAINING UNDERLAYERS

The present invention relates generally to underlayers and methods of using them, and particularly to wet-strippable silicon-containing underlayers and their use in the manufacture of electronic devices.

In conventional photolithographic processes, the resist pattern is used as a mask for pattern transfer to the substrate by suitable etching processes, such as by reactive ion etch (RIE). The continued decrease in the thickness of the resist used makes the resist pattern unsuitable as a mask for pattern transfer by RIE processes. As a result, alternate processes have been developed using three, four or more layers as a mask for pattern transfer. For example, in a trilayer process a silicon-containing antireflective layer is disposed between an underlayer/organic planarizing layer and the resist layer. Due to the alternating selectivity towards fluorine and oxygen-containing RIE chemistry these layers possess, this trilayer scheme provides highly selective pattern transfer from the resist pattern on top of the Si-containing layer into the substrate below the underlayer.

The resistance of the silicon-containing underlayer toward oxide-etch chemistry allows this layer to function as an etch mask. Such silicon-containing underlayers are comprised of a crosslinked siloxane network. The etch resistance of these materials results from the silicon content, with a higher silicon content providing better etch resistance. In current 193 nm lithographic processes, such silicon-containing underlayers contain ≥40% silicon. Such high silicon content and siloxane network structure in these materials makes their removal challenging. Fluorine-containing plasma and hydrofluoric acid (HF) can both be used to remove (or strip) these silicon-containing layers. However, both F-plasma and HF will remove not only these silicon-containing materials but also other materials that are desired to remain, such as the substrate. Wet stripping using tetramethylammonium hydroxide (TMAH) in higher concentrations, such as ≥5 wt %, can be used to remove at least some of these silicon-containing layers, but these higher concentrations of TMAH also risk damaging the substrate. Silicon-containing layers having a relatively lower amount of silicon (≤17%) can sometimes be removed using "piranha acid" (concentrated $H_2SO_4$+30% $H_2O_2$), but such an approach has not proved successful with silicon-containing materials having higher silicon content.

One approach to improving the wet strippability of silicon-containing underlayers by incorporating a mixture of dipropylene glycol (DPG) and tetraethylene glycol (TEG) into the siloxane layer during curing is disclosed in U.S. Pat. No. 7,955,782. However, the specific amount of DPG and TEG incorporated into silicon-containing film is not known as a portion of both the DPG and TEG is volatilized during curing of the silicon-containing film, which also makes the exact weight percentage of silicon in the film unknown. U.S. Pat. App. Pub. No. 2014/0186774 discloses silicon-containing underlayers that can be removed by acid, where the silicon-containing materials are aqueous base insoluble having a multiplicity of hydrocarbon groups derivatized with hydroxyl groups in the absence of Si—O—C and Si—OH bonds. The formation of Si—O—Si bonds during curing of the silicon-containing material layer is avoided in this reference. While the silicon-containing underlayers in U.S. Pat. App. Pub. No. 2014/0186774 might be acid-strippable, such silicon-containing underlayers may not provide the desired etch resistance during pattern transfer due to the lack of Si—O—Si bonds. Accordingly, there remains a need for a silicon-containing underlayers that provide desired etch selectivity during pattern transfer and are readily removable by wet chemical processes.

A composition comprising: one or more curable silicon-containing polymers comprising a backbone comprising Si—O linkages; and one or more organic blend polymers comprising as polymerized units one or more ethylenically unsaturated monomers having an acidic proton and having a pKa in water from −5 to 8. Preferably, the composition further comprises one or more organic solvents.

The present invention further provides a silicon-containing film for use in a multilayer resist process formed from the composition described above.

Also provided by the present invention is a process comprising: (a) coating a substrate with a coating composition comprising one or more curable silicon-containing polymers comprising a backbone comprising Si—O linkages, and one or more organic blend polymers comprising as polymerized units one or more ethylenically unsaturated monomers having an acidic proton and having a pKa in water from −5 to 13, and one or more organic solvents to form a curable silicon-containing polymer layer on the substrate; (b) curing the silicon-containing polymer layer to form a siloxane underlayer; (c) disposing a layer of a photoresist on the siloxane underlayer; (d) pattern-wise exposing the photoresist layer to form a latent image; (e) developing the latent image to form a patterned photoresist layer having a relief image therein; (f) transferring the relief image to the substrate; and (g) removing the siloxane underlayer by wet stripping.

It will be understood that when an element is referred to as being "adjacent" to or "on" another element, it can be directly adjacent to or on the other element or intervening elements may be present therebetween. In contrast, when an element is referred to as being "directly adjacent" or "directly on" another element, there are no intervening elements present. It will be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; ppm=part per million by weight unless otherwise noted; μm=micron=micrometer; nm=nanometer; Å=angstrom; L=liter; mL=milliliter; sec.=second; min.=minute; hr.=hour; and Da=dalton. All amounts are percent by weight and all ratios are molar ratios, unless otherwise noted. All numerical ranges are inclusive and combinable in any order, except where it is clear that such numerical ranges are constrained to add up to 100%. "Wt %" refers to percent by weight, based on the total weight of a referenced composition, unless otherwise noted. The articles "a", "an" and "the" refer to the singular and the plural. As used herein, the term "and/or" includes any and all combinations of one or more of the associated listed items. $M_w$ refers to weight average molecular weight and is determined by gel permeation chromatography (GPC) using polystyrene standards.

As used throughout the specification, the term "alkyl" includes linear, branched and cyclic alkyl. The term "alkyl" refers to an alkane radical, and includes alkane monoradicals, diradicals (alkylene), and higher-radicals. If no number of carbons is indicated for any alkyl or heteroalkyl, then 1-12 carbons are contemplated. The term "heteroalkyl" refers to an alkyl group with one or more heteroatoms, such as nitrogen, oxygen, sulfur, phosphorus, replacing one or more carbon atoms within the radical, for example, as in an ether or a thioether. The term "alkenyl" refers to an alkene radical, and includes alkene monoradicals, diradicals (alkenylene), and higher-radicals. "Alkenyl" refers to linear, branched and cyclic alkene radicals unless otherwise specified. The term "alkynyl" refers to an alkyne radical, and includes alkyne monoradicals, diradicals, and higher-radicals. "Alkynyl" refers to linear and branched alkyne radicals. If no number of carbons is indicated for any alkenyl or alkynyl, then 2-12 carbons are contemplated. "Organic residue" refers to the radical of any organic moiety, which may optionally contain one or more heteroatoms, such as oxygen, nitrogen, silicon, phosphorus, and halogen, in addition to carbon and hydrogen. An organic residue may contain one or more aryl or non-aryl rings or both aryl and non-aryl rings. The term "hydrocarbyl" refers to a radical of any hydrocarbon, which may be aliphatic, cyclic, aromatic or a combination thereof, and which may optionally contain one or more heteroatoms, such as oxygen, nitrogen, silicon, phosphorus, and halogen, in addition to carbon and hydrogen. The hydrocarbyl moieties may contain aryl or non-aryl rings or both aryl and non-aryl rings, such as one or more alicyclic rings, or aromatic rings or both alicyclic and aromatic rings. When a hydrocarbyl moiety contains two or more alicyclic rings, such alicyclic rings may be isolated, fused or spirocyclic. Alicyclic hydrocarbyl moieties include single alicyclic rings, such as cyclopentyl and cyclohexyl, as well as bicyclic rings, such as dicyclopentadienyl, norbornyl, and norbornenyl. When the hydrocarbyl moiety contains two or more aromatic rings, such rings may be isolated or fused. By the term "curing" is meant any process, such as polymerization or condensation, that increases the molecular weight of a material or composition. "Curable" refers to any material capable of being cured under certain conditions. The term "oligomer" refers to dimers, trimers, tetramers and other relatively low molecular weight materials that are capable of further curing. The term "polymer" includes oligomers and refers to homopolymers, copolymers, terpolymers, tetrapolymers and the like. As used herein, the term "(meth)acrylate" refers to both acrylate and methacrylate. Likewise, the terms "(meth)acrylic acid", "(meth)acrylonitrile" and "(meth)acrylamide" refer to acrylic acid and methacrylic acid, acrylonitrile and methacrylonitrile, and acrylamide and methacrylamide, respectively.

The process of the invention comprises: (a) coating a substrate with a coating composition comprising one or more curable silicon-containing polymers comprising a backbone comprising Si—O linkages, and one or more organic blend polymers comprising as polymerized units one or more ethylenically unsaturated monomers having an acidic proton and having a pKa in water from −5 to 13, and one or more organic solvents to form a curable silicon-containing polymer layer on the substrate; (b) curing the silicon-containing polymer layer to form a siloxane underlayer; (c) disposing a layer of a photoresist on the siloxane underlayer; (d) pattern-wise exposing the photoresist layer to form a latent image; (e) developing the latent image to form a patterned photoresist layer having a relief image therein; (f) transferring the relief image to the substrate; and (g) removing the siloxane underlayer by wet stripping. Preferably, the coating composition further comprises one or more cure catalysts.

Any curable silicon-containing polymer comprising a backbone comprising Si—O linkages may suitably be used in the compositions of the invention. As used herein, the term "backbone" refers to the main polymer chain. It is preferred that the curable silicon-containing polymer comprises a backbone comprising (—Si—O—) repeating units, such as (—SiL$_2$-O—)$_z$, where each L is independently a monovalent or divalent organic or inorganic radical and z is an integer from 2 to 2000. Such curable silicon-containing polymers are formed from polymerized units of one or more silicon monomers. Silicon monomers are often referred to by the number of hydrolyzable moieties bonded to silicon in the monomer. For example, "M monomer" refers to a silicon monomer having one hydrolyzable moiety, such as monomers of formula R$_3$SiX, "D monomer" refers to a silicon monomer having two hydrolyzable moieties such as monomers of the formula R$_2$SiX$_2$, "T monomer" refers to a silicon monomer having three hydrolyzable moieties such as monomers of the formula RSiX$_3$, and "Q monomer" refers to a to a silicon monomer having four hydrolyzable moieties such as monomers of the formula SiX$_4$, where X in each monomer is a hydrolyzable moiety and R in each monomer is a non-hydrolyzable moiety. As used herein, "hydrolyzable moiety" refers to any moiety capable to being hydrolyzed under conditions used to condense, cure, or otherwise polymerize silane monomers. Exemplary hydrolyzable moieties in silicon monomers include, but are not limited to, halogens, alkoxy, carboxylate, hydroxy, enoxy, oximino, amino, and the like.

Silicon-containing polymers useful in the present invention may comprise as polymerized units any combination of M monomers, D monomers, T monomers, Q monomers, or dimers or trimers of any of the foregoing. It is preferred that the silicon-containing polymer comprises as polymerized units one or more D monomers and/or one or more T monomers, and more preferably one or more T monomers. It is further preferred that the silicon-containing polymer comprises one or more T monomers and one or more Q monomers, and yet more preferably two or more T monomers and one Q monomer. Preferably, the silicon-containing polymers comprise as polymerized units one or more monomers chosen from formulae (3), (4), (5a), and (5b)

  (3)

  (4)

  (5a)

  (5b)

wherein each Y, Y$^1$ and Y$^2$ is independently a hydrolyzable moiety chosen from halo, C$_{1-10}$ alkoxy, and —O—C(O)—R$^4$; R$^3$ is C$_{1-30}$ hydrocarbyl moiety or substituted C$_{1-30}$ hydrocarbyl moiety; each R$^4$ is chosen from H, OH, C$_{1-10}$ alkyl, and C$_{1-10}$ alkoxy; and each R$^5$ is independently C$_{1-30}$ hydrocarbyl moiety or substituted C$_{1-30}$ hydrocarbyl moiety. Each Y, Y$^1$, and Y$^2$ is preferably chosen from bromo, chloro, C$_{1-4}$ alkoxy, and —O—C(O)—C$_{1-4}$ alkyl. More preferably, the silicon-containing polymers comprise as polymerized units one or more monomers of formula (3) described above and one or more monomers of formula (4) described above. It is more preferred that the present silicon-containing polymers comprise as polymerized units two or more monomers of formula (3) and one monomer of formula (4). In an alternate preferred embodiment, the present silicon-containing polymers comprise as polymerized units one or more monomers of formula (5a), one or more monomers of formula (5b), or a mixture of one or more monomers of formula (5a) and one or more monomers of formula (5b). In another preferred embodiment, the present silicon-containing polymers comprise as polymerized units one or more monomers of formula (3) as described above, one or more monomers of formula (4) as described above, and one or more monomers of formulae (5a) and/or (5b) as described above. It is further preferred that the present silicon-containing polymers comprise as polymerized units one or more monomers of formula (4), or one or more monomers of formula (5a), or one or more monomers of formula (5b), and more preferably one or more monomers of formula (4) and one or more monomers of formulae (5a) and/or (5b).

The $C_{1-30}$ hydrocarbyl moiety of $R^3$ and $R^5$ in formulae (3) and (5a) and (5b), respectively, may be any linear, branched, alicyclic, or aromatic hydrocarbon radical having from 1 to 30 carbon atoms. Suitable $C_{1-30}$ hydrocarbyl moieties of $R^3$ or $R^5$ include, without limitation, $C_{1-30}$ alkyl, $C_{2-30}$ alkenyl, $C_{2-30}$ alkynyl, $C_{3-30}$ cycloalkyl, and $C_{6-30}$ aryl, and preferably are $C_{1-20}$ alkyl, $C_{2-20}$ alkenyl, $C_{2-20}$ alkynyl, $C_{3-20}$ cycloalkyl, and $C_{6-25}$ aryl. The substituted $C_{1-30}$ hydrocarbyl moiety of $R^3$ and $R^5$ in formulae (3) and (5), respectively, refers to any $C_{1-30}$ hydrocarbyl moiety having one or more of its hydrogens replaced with one or more substituted moieties chosen from hydroxy, mercapto, $C_{1-20}$ alkoxy, amino, $C_{1-20}$ alkylamino, di-$C_{1-20}$ alkylamino, cyano, halogen, epoxide, —C(=O)O—$R^{17}$, —C(=O)—$N(R^{17})_2$, and —C(=O)—O—C(=O)—$R^{17}$, wherein each $R^{17}$ is chosen from H and $C_{1-20}$ alkyl.

Preferred silicon-containing polymers useful in the present compositions comprise one or more units of formula (6) and optionally one or more units of formula (7)

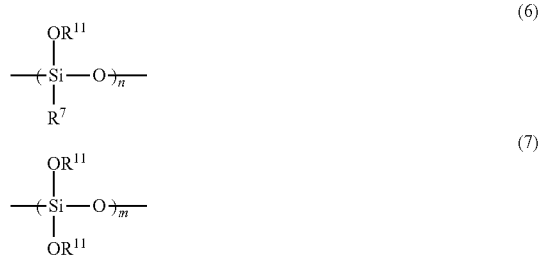

wherein each $R^7$ is independently chosen from $C_{1-30}$ hydrocarbyl moiety, substituted $C_{1-30}$ hydrocarbyl moiety, and $OR^8$; each $R^8$ is chosen from H, $Si(R^9)_xO(R^{10})_y$, $C_{1-30}$ hydrocarbyl moiety, and substituted $C_{1-30}$ hydrocarbyl moiety; each $R^9$ is independently $C_{1-30}$ hydrocarbyl moiety or substituted $C_{1-30}$ hydrocarbyl moiety; each $R^{10}$ is independently H, $C_{1-10}$ alkyl or —C(O)—$C_{1-10}$ alkyl; each $R^{11}$ is independently chosen from H, $C_{1-10}$ alkyl, and —C(O)—$C_{1-10}$ alkyl; n refers to the number of repeat units of formula (6) in the polymer and is an integer from 1 to 100; m refers to the number of repeat units of formula (7) in the polymer and is an integer from 0 to 50; x=0 to 3; Y=0 to 3, and x+y=3. Suitable $C_{1-30}$ hydrocarbyl moieties of $R^6$, $R^7$, $R^8$ and $R^9$ include, without limitation, $C_{1-30}$ alkyl, $C_{2-30}$ alkenyl, $C_{2-30}$ alkynyl, $C_{3-30}$ cycloalkyl, and $C_{6-30}$ aryl, and preferably are $C_{1-20}$ alkyl, $C_{2-20}$ alkenyl, $C_{2-20}$ alkynyl, $C_{3-20}$ cycloalkyl, and $C_{6-25}$ aryl. The substituted $C_{1-30}$ hydrocarbyl moiety of $R^6$, $R^7$, $R^8$ and $R^9$ in formula (6) refers to any $C_{1-30}$ hydrocarbyl moiety having one or more of its hydrogens replaced with one or more substituted moieties chosen from hydroxy, mercapto, $C_{1-20}$ alkoxy, amino, $C_{1-20}$ alkylamino, di-$C_{1-20}$ alkylamino, cyano, and halo. Preferably, $R^7$ is $OR^8$. Preferably, each $R^{16}$ is $C_{1-6}$ alkoxy or —C(O)—$C_{1-6}$ alkyl. It is preferred that each $R^{11}$ is independently chosen from H, $C_{1-6}$ alkyl, and —C(O)—$C_{1-6}$ alkyl, and more preferably from H, $C_{1-4}$ alkyl, and —C(O)—$C_{1-4}$ alkyl. It is preferred that n is an integer from 1 to 75 and more preferably from 2 to 50. Preferably, m is an integer from 1 to 75, and more preferably from 2 to 50. Such preferred silicon-containing polymers preferably have one or more terminal groups chosen from H, —OH, $R^t$, and $OR^t$, wherein each $R^t$ is independently $C_{1-30}$ hydrocarbyl moiety or substituted $C_{1-30}$ hydrocarbyl moiety.

Preferred monomers useful in forming the silicon-containing polymers include, without limitation, methyltrichlorosilane, methyltrimethoxysilane, methyltriethoxysilane, methyltriacetoxysilane, ethyltrichlorosilane, ethyltrimethoxysilane, ethyltriethoxysilane, ethyltriacetoxysilane, propyltrichlorosilane, propyltrimethoxysilane, propyltriethoxysilane, propyltriacetoxysilane, hydroxypropyltrichlorosilane, hydroxypropyltrimethoxysilane, hydroxypropyltriethoxysilane, hydroxypropyltriacetoxysilane, mercaptopropyltrichlorosilane, mercaptopropyltrimethoxysilane, mercaptopropyltriethoxysilane, mercaptopropyltriacetoxy-silane, cyclopentyltrichlorosilane, cyclopentyltrimethoxysilane, cyclopentyltriethoxysilane, cyclopentyltriacetoxysilane, vinyltrichlorosilane, vinyltrimethoxysilane, vinyltriethoxysilane, vinyltriacetoxysilane, phenyltrichlorosilane, phenyltrimethoxysilane, phenyltriethoxysilane, phenyltriacetoxysilane, biphenyltrichlorosilane, biphenyltrimethoxysilane, biphenyltriethoxy-silane, biphenyltriacetoxysilane, dimethyldichlorosilane, dimethyldimethoxysilane, dimethyldiethoxysilane, dimethyldiacetoxysilane, diethyldichlorosilane, diethyldimethoxysilane, diethyldiethoxysilane, diethyldiacetoxysilane, diphenyldichlorosilane, diphenyldimethyoxy-silane, diphenyldiethoxysilane, diphenyldiacetoxysilane, methylphenyldichlorosilane, methylphenyldimethoxysilane, methylphenyldiethoxysilane, methylphenyldiacetoxysilane, methylvinyldichlorosilane, methylvinyldimethoxysilane, methylvinyldiethoxysilane, methylvinyldiacetoxysilane, divinyldichlososilane, divinyldimethoxysilane, divinyldiethoxysilane, divinyldiacetoxysilane, tetrachlorosilane, tetramethoxysilane, tetraethoxysilane, and tetraacetoxysilane.

Methods of preparing silicon-containing polymers are well-known in the art and any suitable method may be used to prepare the present curable silicon-containing polymers comprising a backbone comprising Si—O linkages. In general, the monomers used to form the present silicon-containing polymers are reacted with water, preferably in the presence of a catalyst which may be either acidic or basic, and optionally in the presence of one or more organic solvents. Preferably, an acid catalyst is used. Such reaction is carried out at a suitable reaction temperature. The monomers may be mixed together first, or may be separately added to the reaction vessel. The amount of water used is well-known to those skilled in the art, and is preferably from 0.5 to 1.5 equivalents relative to each hydrolyzable moiety present in the silane monomers, and more preferably from 0.75 to 1.25 equivalents, although greater or lesser amounts of water may be used. Suitable reaction temperatures for forming the present silicon-containing polymers are from 0 to 130° C., and preferably from 5 to 120° C. Suitable acid catalysts include mineral acids, carboxylic acids, and sulfonic acids such as alkanesulfonic acids and arylsulfonic acids. Exemplary acid catalysts include, but are not limited to: hydrofluoric acid, hydrochloric acid, hydrobromic acid, sulfuric acid, nitric acid, perchloric acid, phosphoric acid, acetic acid, propionic acid, butanoic acid, oxalic acid, malonic acid, trifluoroacetic acid, trichloroacetic acid, methanesulfonic acid, trifluoromethanesulfonic acid, ethanesulfonic acid, propanesulfonic acid, benzenesulfonic acid, toluenesulfonic acid, and phenolsulfonic acid, and preferably acetic acid, butanoic acid, toluenesulfonic acid, trifluoromethanesulfonic acid, and hydrochloric acid. Suitable basic catalysts are well-known to those skilled in the art. In general, the amount of such acid catalyst ranges from 0 to 1 equivalent relative to the silane monomers, preferably from 0.05 to 0.9, and more preferably from 0.05 to 0.75 equivalents.

A wide variety of optional organic solvents may be used in the preparation of the present silicon-containing polymers, such as alcohols, ketones, esters, ethers, aromatic hydrocarbons, alkanes, lactones, and the like. Exemplary organic solvents include, without limitation, methanol, ethanol, 1-propanol, 2-propanol, 1-butanol, 2-butanol, 2-methyl-1-propanol, 4-methyl-2-pentanol, ethylene glycol, propylene glycol, acetone, acetonitrile, tetrahydrofuran, toluene, hexane, ethyl acetate, ethyl lactate, cyclohexane, methyl-2-n-amyl ketone, butanediol monomethyl ether, propylene glycol monomethyl ether (PGME), propylene glycol monoethyl ether (PGEE), ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, gamma-butylolactone, and mixtures thereof. The amount of such optional organic solvent is from 0 to 80%, and preferably from 10 to 50%, relative to the total weight of the silane monomers.

Alternatively, one or more silicon monomers of formulae (3), (4), (5a), or (5b) or dimers or trimers thereof are first reacted with water, optionally in the presence of an organic solvent, and optionally in the presence of a catalyst, and preferably an acid catalyst. Following such hydrolysis and/or condensation reaction, the resulting silicon-containing polymer may optionally be reacted with one or more additional monomers.

Suitable silicon-containing polymers have a $M_w$ of from 1000 to 60000 Da, preferably from 2000 to 40000 Da, and more preferably from 3000 to 35000 Da. If desired, the silicon-containing polymers may be isolated from the reaction mixture by any suitable means, such as by precipitation, crystallization, chromatography, and the like. The silicon-containing polymers may be used as is or may be further purified by any means known in the art.

Any organic polymer may be suitably used as the organic blend polymer in the present coating compositions provided such organic polymer: comprises as polymerized units one or more ethylenically unsaturated first monomers having an acidic proton and having a pKa in water from −5 to 13; does not destabilize the silicon-containing polymer; does not phase separate from the silicon-containing polymer when the composition is coated on a substrate such as a semiconductor device substrate; and enhances the wet strippability of the silicon-containing polymer as compared to the wet strippability of the silicon-containing polymer without the organic polymer. It is preferred that the organic blend polymer comprises as polymerized units one or more monomers having an acidic proton and having a pKa in water from −5 to 13, more preferably from −5 to 10, yet more preferably from −5 to 8, and still more preferably from −3 to 8. The ethylenically unsaturated first monomer comprises one or more functional groups having an acidic proton and having a pKa in water from −5 to 13. Suitable functional groups include carboxyl groups (—C(=O)—OH) and aromatic hydroxyl groups (Ar—OH, where Ar is an aryl moiety).

Preferably, the organic blend polymer comprises as polymerized units one or more ethylenically unsaturated monomers of the formula (1)

wherein Z is an organic residue having from 1 to 30 carbon atoms and an acidic proton having a pKa in water from −5 to 13; $R^{20}$ is chosen from H, $C_{1-10}$ alkyl, $C_{1-10}$ haloalkyl, halo, C(=O)$R^{24}$ and Z; each of $R^{21}$ and $R^{22}$ are independently chosen from H, $C_{1-4}$ alkyl, $C_{1-4}$ haloalkyl, halo, CN and Z; $R^{24}$ is independently chosen from O$R^{25}$ and N($R^{26}$)$_2$; $R^{25}$ is chosen from H, and $C_{1-20}$ alkyl; and each $R^{26}$ is independently chosen from H, $C_{1-20}$ alkyl, and C aryl; wherein Z and $R^{20}$ may be taken together to form a 5 to 7-membered unsaturated ring. Preferably, Z and $R^{20}$ are not taken together to form a 5 to 7-membered unsaturated ring. It is preferred that Z has an acidic proton having a pKa in water from −5 to 12, more preferably from −5 to 10, yet more preferably from −5 to 8, and still more preferably from −3 to 8. Preferably, each Z is independently chosen from an organic residue having from 1 to 30 carbon atoms and having one or more functional groups chosen from —C(=O)—O$R^{23}$ and an aryl moiety having from 6 to 20 carbon atoms and one or more aromatic hydroxyl groups; wherein each $R^{23}$ is H or an aryl moiety having from 6 to 20 carbon atoms and one or more aromatic hydroxyl groups. As used herein, the term "aromatic hydroxyl group" refers to a hydroxy group (—OH) bound directly to a carbon atom of an aryl moiety. Exemplary aryl moieties having from 6 to 20 carbon atoms and one or more aromatic hydroxyl groups include, but are not limited to, phenol, dihydroxybenzene, trihydroxybenzene. hydroxynaphthalene, dihydroxynaphthalene, hydroxyanthracene, dihydroxyanhracene, trihydroxyanthracene, hydroxyindole, and the like. As used herein, the term "aryl" refers to aromatic carbocycles and aromatic heterocycles. It is preferred that aryl moieties are aromatic carbocycles. "Substituted aryl" refers to any aryl moiety having one or more of its hydrogens replaced with one or more substituents chosen from halogen, $C_{1-6}$ alkyl, halo $C_{1-6}$ alkyl, $C_{1-6}$ alkoxy, halo $C_{1-6}$ alkoxy, phenyl, and phenoxy, preferably from halogen, $C_{1-6}$ alkyl, halo $C_{1-4}$ alkyl, $C_{1-6}$ alkoxy, phenyl, and phenoxy, and more preferably from halogen, $C_{1-6}$ alkyl, $C_{1-6}$ alkoxy, phenyl, and phenoxy. Preferably, a substituted aryl has from 1 to 3 substituents, and more preferably 1 or 2 substituents. Exemplary ethylenically unsaturated monomers of formula (1) include, without limitation: hydroxy-substituted vinyl aromatic monomers such as hydroxystyrene, o-courmaric acid, m-courmaric acid, p-courmaric acid, and hydroxyvinylnaphthylene; carboxyl-substituted vinyl aromatic monomers such as vinyl benzoic acid; ethylenically unsaturated carboxylic acids such as cinnamic acid, maleic acid, fumaric acid, crotonic acid, citraconic acid, itaconic acid, 3-pyridine (meth)acrylic acid, 2-phenyl (meth)acrylic acid, (meth) acrylic acid, 2-methylenemalonic acid, cyclopentenecarboxylic acid, methylcyclopentenecarboxylic acid, cyclohexenecarboxylic acid, and 3-hexene-1,6-dicarboxylic acid; and hydroxyaryl esters of ethylenically unsaturated carboxylic acids, such as hydroxyphenyl (meth)acrylate, hydroxybenzyl (meth)acrylate, hydroxynaphthyl (meth)acrylate, and hydroxyanthracenyl (meth)acrylate.

Organic blend polymers useful in the present invention may further comprise as polymerized units one or more second ethylenically unsaturated monomers different from the one or more ethylenically unsaturated first monomers having an acidic proton and having a pKa in water from −5 to 13. Any ethylenically unsaturated second monomer may be used.

Organic blend polymers useful in the present compositions may optionally further comprise as polymerized units one or more monomers of formula (2)

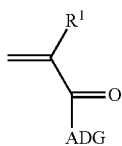

(2)

wherein ADG is an acid decomposable group; and R' is independently chosen from H, $C_{1-4}$ alkyl, $C_{1-4}$ haloalkyl, halo, and CN. $R^1$ is preferably independently chosen from H, $C_{1-4}$ alkyl, $C_{1-4}$ fluoroalkyl, fluoro, and CN, more preferably from H, $C_{1-4}$ alkyl, trifluoromethyl, fluoro, and CN, even more preferably from H, methyl, trifluoromethyl, fluoro, and CN, and most preferably $R^1$ is H or methyl. In formula (1a), ADG is an acid decomposable group having from 2 to 30 carbon atoms. The term "acid decomposable group", as used herein, refers to any functional group capable of being decomposed by acid to form a different functional group having increased aqueous base solubility as compared to the acid decomposable group. Suitable acid decomposable groups include, but are not limited to, —O—$C_{4-30}$ hydrocarbyl moiety where the $C_{4-30}$ hydrocarbyl moiety is bonded to the oxygen atom through a secondary or tertiary carbon atom, a $C_{2-30}$ hydrocarbyl moiety having an anhydride moiety, a $C_{2-30}$ hydrocarbyl moiety having an imide moiety, and a $C_{4-30}$ organic residue comprising an acetal functional group. Preferred acid decomposable groups are —O—$C_{4-30}$ hydrocarbyl moiety where the $C_{4-30}$ hydrocarbyl moiety is bonded to the oxygen atom through a tertiary carbon atom, and a $C_{4-30}$ organic residue comprising an acetal functional group, and more preferably —O—$C_{4-30}$ hydrocarbyl moiety where the $C_{4-30}$ hydrocarbyl moiety is bonded to the oxygen atom through a tertiary carbon atom, and a $C_{4-20}$ organic residue comprising an acetal functional group. As used herein, the term "acetal" also embraces "ketal", "hemiacetal", and "hemiketal." Exemplary acid decomposable groups include, without limitation, —$NR^3R^4$, —$OR^5$, and —O—C(=O)—$R^6$, wherein $R^3$ and $R^4$ are each independently chosen from H, $C_{1-20}$ alkyl, and $C_{6-10}$ aryl; $R^5$ is a $C_{4-30}$ organic residue bound to the oxygen through a secondary or tertiary carbon (that is, a carbon that is bound to two or three other carbons, respectively) or a $C_{4-30}$ organic residue comprising an acetal functional group; and $R^6$ is chosen from H, $C_{1-30}$ alkyl, and $C_{6-30}$ aryl. Preferably, $R^5$ has from 4 to 20 carbon atoms. It is further preferred that $R^5$ is a branched or cyclic moiety. When $R^5$ contains a cyclic moiety, such cyclic moiety typically has from 4 to 8 atoms in the ring, and preferably 5 or 6 atoms in the ring. $R^5$ may optionally contain one or more heteroatoms such as oxygen. Preferably, $R^5$ is a branched aliphatic or a cycloaliphatic moiety optionally containing one or more heteroatoms.

Preferred compounds of formula (2) are those of formula (2a)

(2a)

wherein $R^5$ is chosen from a $C_{4-20}$ organic residue bound to the oxygen through a tertiary carbon or a $C_{4-20}$ organic residue comprising an acetal functional group; and R' is chosen from H, $C_{1-4}$ alkyl, $C_{1-4}$ haloalkyl, halo, and CN. More preferably, $R^5$ has the structure shown in formula (8a) or (8b)

(8a)

(8b)

wherein each of $R^{13}$, $R^{14}$ and $R^{15}$ is independently an organic residue having from 1 to 6 carbon atoms; $R^{13}$ and $R^{14}$ may be taken together to form a 4 to 8 membered ring; L is a divalent linking group or a single chemical bond; A represents an acetal functional group; and * indicates the point of attachment to the ester oxygen. It is preferred that each of $R^{13}$, $R^{14}$ and $R^{15}$ is independently chosen from $C_{1-6}$ alkyl. When $R^{13}$ and $R^{14}$ are taken together to form a 4 to 8 membered ring, such ring may be a single ring or may be bicyclic, and may optionally contain one or more heteroatoms chosen from oxygen, sulfur and nitrogen, preferably oxygen and sulfur and more preferably oxygen. Preferably, $R^{13}$ and $R^{14}$ may be taken together to form a 5 to 8 membered ring. Suitable 4 to 8 membered rings include, but are not limited to, cyclopentyl, cyclohexyl, cycloheptyl, cyclooctyl, norbornyl, and oxabicylco[2.2.1]heptyl, preferably cyclopentyl, cyclohexyl, norbornyl, and oxabicylco[2.2.1]heptyl, and more preferably cyclopentyl and cyclohexyl. Suitable divalent linking groups include $C_{1-10}$ alkylene, and preferably $C_{1-5}$ alkylene. Preferably, the acetal functional group is a 5 or 6-membered ring cyclic ketal, and more preferably a cyclic ketal formed from acetone. Exemplary moieties for $R^5$ include, without limitation: tert-butyl; 2,3-dimethyl-2-butyl; 2,3,3-trimethyl-2-butyl; 2-methyl-2-butyl; 2-methyl-2-pentyl; 3-methyl-3-pentyl; 2,3,4-trimethyl-3-pentyl; 2,2,3,4,4-pentamethyl-3-pentyl; 1-methyl-1-cyclopentyl; 1-ethyl-1-cyclopentyl; 1,2-dimethyl-1-cyclopentyl; 1,2,5-trimethyl-1-cyclopentyl; 1,2,2-trimethyl-cyclopentyl; 1,2,2,5-tetramethyl-1-cyclopentyl; 1,2,2,5,5-pentamethyl-1-cyclopentyl; 1-methyl-1-cyclohexyl;

1-ethyl-1-cyclohexyl; 1,2-dimethyl-1-cyclohexyl; 1,2,6-trimethyl-1-cyclohexyl; 1,2,2,6-tetramethyl-1-cyclohexyl; 1,2,2,6,6-pentamethyl-1-cyclohexyl; 2,4,6-trimethyl-4-heptyl; 3-methyl-3-norbornyl; 3-ethyl-3-norbornyl; 6-methyl-2-oxabicylco[2.2.1]hept-6-yl; and 2-methyl-7-oxabicylco[2.2.1]hept-2-yl. Preferably, $R^5$ is chosen from tert-butyl; 2,3-dimethyl-2-butyl; 2,3,3-trimethyl-2-butyl; 2-methyl-2-butyl; 2-methyl-2-pentyl; 3-methyl-3-pentyl; 2,3,4-trimethyl-3-pentyl; 2,2,3,4,4-pentamethyl-3-pentyl; 1-methyl-1-cyclopentyl; 1-ethyl-1-cyclopentyl; 1,2-dimethyl-1-cyclopentyl; 1,2,5-trimethyl-1-cyclopentyl; 1,2,2-trimethyl-cyclopentyl; 1,2,2,5-tetramethyl-1-cyclopentyl; 1,2,2,5,5-pentamethyl-1-cyclopentyl; 1-methyl-1-cyclohexyl; 1-ethyl-1-cyclohexyl; 1,2-dimethyl-1-cyclohexyl; 1,2,6-trimethyl-1-cyclohexyl; 1,2,2,6-tetramethyl-1-cyclohexyl; 1,2,2,6,6-pentamethyl-1-cyclohexyl; and 2,4,6-trimethyl-4-heptyl. Suitable monomers of formulae (1), (1a), and (1b) may be available commercially or made by a variety of methods known in the art, such as is disclosed in U.S. Pat. Nos. 6,136,501; 6,379,861; and 6,855,475.

Optionally, the organic blend polymer may further comprise as polymerized units one or more monomers of formula (9)

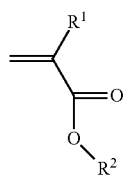

wherein R' is independently chosen from H, $C_{1-4}$ alkyl, $C_{1-4}$ haloalkyl, halo, and CN; and $R^2$ is a monovalent organic residue having a lactone moiety. In formula (9), $R^2$ is a $C_{4-20}$ monovalent organic residue comprising a lactone moiety. $R^2$ may comprise any suitable lactone moiety, and preferably comprises a 5 to 7-membered lactone, which may be optionally substituted. Suitable substituents on the lactone ring are $C_{1-10}$ alkyl moieties. Suitable lactone moieties for $R^2$ are those having formula (10)

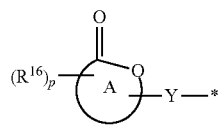

wherein A is a 5 to 7-membered ring lactone; each $R^{16}$ is independently chosen from $C_{1-10}$ alkyl; p is an integer from 0 to 3; Y is a chemical bond or a divalent linking residue having from 1 to 10 carbon atoms; and * indicates the point of attachment to the oxygen atom of the ester. It is preferred that each $R^{16}$ is independently chosen from $C_{1-6}$ alkyl, and more preferably $C_{1-4}$ alkyl. Examples of $R^{16}$ are methyl, ethyl, n-propyl, iso-propyl, n-butyl, sec-butyl, and iso-butyl. Preferably, p=0 or 1. Suitable divalent linking residues for Y include, but are not limited to, divalent organic residues having from 1 to 20 carbon atoms. Suitable divalent organic residues for Y include, without limitation, $C_{1-20}$ hydrocarbyl moieties, $C_{1-20}$ heteroatom-containing hydrocarbyl moieties, and substituted $C_{1-20}$ hydrocarbyl moieties. The term "$C_{1-20}$ heteroatom-containing hydrocarbyl moieties" refers to hydrocarbyl moieties having one or more heteroatoms, such as nitrogen, oxygen, sulfur, phosphorus, within the hydrocarbyl chain. Exemplary heteroatoms include, but are not limited to, —O—, —S—, —N(H)—, —N($C_{1-20}$ hydrocarbyl)-, —C(=O)—O—, —S(=O)—, —S(=O)$_2$—, —C(=O)—NH—, and the like. "Substituted $C_{1-20}$ hydrocarbyl moieties" refers to any hydrocarbyl moiety having one or more hydrogens replaced with one or more substituents such as halogen, cyano, hydroxy, amino, mercapto, and the like. It is preferred that $R^2$ is chosen from gamma-butyrolactone (GBLO), beta-butyrolactone, gamma-valerolactone, delta-valerolactone, and caprolactone. More preferably, $R^2$ is GBLO. Monomers of formula (9) are generally commercially available or may be prepared by methods known in the art. It is preferred that the present organic blend polymers comprise as polymerized units one or more monomers of formula (1) and one or more monomers of formula (9), and more preferably one or more monomers of formula (1) and one or more monomers chosen from formulae (9) and (10).

Ethylenically unsaturated monomers useful in preparing the present organic blend polymers are well-known in the art and are generally commercially available from a variety of sources or may be prepared by methods well-known in the art. Organic blend polymers of the invention may be prepared by free-radical polymerization according to methods well-known in the art, such as those for preparing (meth)acrylate polymers. Other suitable polymerization methods of preparing the blend polymers include, without limitation, Diels-Alder, living anionic, condensation, cross-coupling, RAFT, ATRP, and the like. The present blend polymers typically have a $M_w$ of 1000 to 10000 Da, preferably from 2000 to 8000 Da, and more preferably from 2500 to 6000 Da. It will be appreciated by those skilled in the art that mixtures of organic blend polymers may suitably be used. Preferably, the organic blend polymer comprises as polymerized units two or more ethylenically unsaturated monomers. When the present organic blend polymer comprises as polymerized units one or more monomers of formula (1) and one or more additional ethylenically unsaturated monomers, such as those of formulae (2), (9) or (10), such monomers are present in a mole ratio of 1:99 to 99:1 of total monomers of formula (1) to total additional ethylenically unsaturated monomers. Preferably, the mole ratio of the total monomers of formula (1) to the total additional ethylenically unsaturated monomers is from 25:75 to 75:25, and more preferably from 40:60 to 60:40.

Preferred compositions of the invention comprise: one or more curable silicon-containing polymers comprising a backbone comprising Si—O linkages; an organic blend polymer comprising as polymerized units one or more monomers of formula (1):

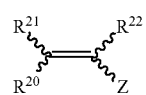

wherein Z is an organic residue having from 1 to 30 carbon atoms and an acidic proton having a pKa in water from −5 to 15; $R^{20}$ is chosen from H, $C_{1-10}$ alkyl, $C_{1-10}$haloalkyl, halo, C(=O)$R^{24}$ and Z; each of $R^{21}$ and $R^{22}$ are independently chosen from H, $C_{1-4}$ alkyl, $C_{1-4}$ haloalkyl, halo, CN and Z; $R^{24}$ is independently chosen from OR$^{25}$ and N(R$^{26}$)$_2$; $R^{25}$ is chosen from H, and $C_{1-20}$ alkyl; and each $R^{26}$ is independently chosen from H, $C_{1-20}$ alkyl, and $C_{6-20}$ aryl; wherein Z and $R^{20}$ may be taken together to form a 5 to 7-membered unsaturated ring. Any of the silicon-containing polymers discussed above may suitably be used. One or more organic blend polymers may be used in the present compositions. Also, one or more organic solvents may be used in these compositions.

Compositions of the invention contain one or more cure catalysts. Suitable cure catalysts include, but are not limited to, thermal acid generators, photoacid generators, and quaternary ammonium salts, preferably thermal acid generators and quaternary ammonium salts, and more preferably quaternary ammonium salts. A thermal acid generator is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids like amine blocked dodecylbenzenesulfonic acid. A wide variety of photoacid generators are known in the art and are also generally commercially available, such as from Wako Pure Chemical Industries, Ltd., and from BASF SE. Suitable quaternary ammonium salts are: quaternary ammonium halides; quaternary ammonium carboxylates; quaternary ammonium sulfonates; quaternary ammonium bisulfates; and the like. Preferred quaternary ammonium salts include; benzyltrialkylammonium halides such as benzyltrimethylammonium chloride and benzyltriethylammonium chloride; tetraalkylammonium halides such as tetramethylammonium halides, tetraethylammonium halides, and tetrabutylammonium halides; tetraalkylammonium carboxylates such as tetramethylammonium formate, tetramethylammonium acetate, tetramethylammonium triflate, tetrabutylammonium acetate, and tetrabutylammonium triflate; tetraalkylammonium sulfonates such as tetramethylammonium sulfonate and tetrabutylammonium sulfonate; and the like. Preferred cure catalysts are tetraalkylammonium halides, and more preferably tetraalkylammonium chlorides. Such quaternary ammonium salts are generally commercially available, such as from Sigma-Aldrich, or may be prepared by procedures known in the art. Such optional curing catalysts are used in the present compositions in an amount of from 0 to 10% of total solids, preferably from 0.01 to 7% of total solids, and more preferably from 0.05 to 5% of total solids.

The present compositions may comprise one or more optional components, such as organic solvents, coating enhancers, one or more stabilizers for the silicon-containing polymer, one or more secondary polymers, and the like. The amount of such optional components used in the present compositions is well within the ability of those skilled in the art.

A variety of organic solvents and water may optionally be used in the present compositions, provided that such solvent dissolves the components of the composition. Preferably, the present compositions comprise one or more organic solvents. Organic solvents may be used alone or a mixture of organic solvents may be used. Suitable organic solvents include, but are not limited to; ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol methyl ether (PGME), propylene glycol ethyl ether (PGEE), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate (EL), methyl hydroxyisobutyrate (HBM), ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as gamma-butyrolactone; and any combination of the foregoing. Preferred solvents are PGME, PGEE, PGMEA, EL, HBM, and combinations thereof.

Coating enhancers are optionally added to the present compositions to improve the quality of a film or layer of the composition that is coated on a substrate. Such coating enhancers may function as plasticizers, surface leveling agents, and the like. Such coating enhancers are well-known to those skilled in the art, and are generally commercially available. Exemplary coating enhancers are: long chain alkanols such as oleyl alcohol, cetyl alcohol, and the like; glycols such as tripropylene glycol, tetraethylene glycol, and the like; and surfactants. While any suitable surfactant may be used as a coating enhancer, such surfactants are typically non-ionic. Exemplary non-ionic surfactants are those containing an alkyleneoxy linkage, such as ethyleneoxy, propyleneoxy, or a combination of ethyleneoxy and propyleneoxy linkages. It is preferred that one or more coating enhancers are used in the present compositions. The coating enhancers are typically used in the present compositions in an amount of 0 to 10% of total solids, preferably from 0.5 to 10% of total solids, and more preferably from 1 to 8% of total solids.

One or more silicon-containing polymer stabilizers may optionally be added to the present compositions. Such stabilizers are useful for preventing unwanted hydrolysis or condensation of the silicon-containing polymers during storage. A variety of such stabilizers are known, and preferably the silicon-containing polymer stabilizer is an acid. Suitable acid stabilizers for the siloxane polymers include, without limitation, carboxylic acids, carboxylic acid anhydrides, mineral acids, and the like. Exemplary stabilizers include oxalic acid, malonic acid, malonic anhydride, malic acid, maleic acid, maleic anhydride, fumaric acid, citraconic acid, glutaric acid, glutaric anhydride, adipic acid, succinic acid, succinic anhydride, and nitric acid. It was surprisingly found that organic blend polymers comprising as polymerized units one or more monomers of formula (1b) were stable in the present coating compositions in the presence of such silicon-containing polymer acid stabilizers. Such stabilizers are used in an amount of 0 to 20% of total solids, preferably from 0.1 to 15% of total solids, more preferably from 0.5 to 10% of total solids, and yet more preferably from 1 to 10% of total solids.

Optionally, one or more secondary polymers may be used in the present compositions, provided that such polymers are compatible with the composition, that is they do not destabilize the composition or any component thereof and that are soluble in any organic solvents used. Such secondary polymers are any polymers that are different from the present silicon-containing polymers and the present organic blend polymers. Suitable secondary polymers include silicon-containing polymers that do not have a backbone containing Si—O linkages, that is, such secondary silicon-containing polymers have a backbone free of Si—O linkages Suitable secondary polymers also include any organic polymer that does not comprise as polymerized units both monomers of formula (1) and formula (2). When used, such secondary polymers are typically used in a relatively minor amount as compared to the silicon-containing polymers and organic blend polymers in the present compositions. When used, the weight ratio of the present silicon-containing and organic blend polymers to the secondary polymer is from 99:1 to 50:50, and preferably from 95:5 to 55:45. It is preferred that no secondary polymer is used in the present compositions.

The compositions of the invention are prepared by combining the one or more curable silicon-containing polymers comprising a backbone comprising Si—O linkages; one or more organic blend polymers comprising as polymerized units one or more monomers of formula (1) and one or more monomers of formula (2) as described above, one or more cure catalysts, and any optional components. Preferably, the present compositions are prepared by combining the one or more curable silicon-containing polymers comprising a backbone comprising Si—O linkages; one or more organic blend polymers comprising as polymerized units one or more monomers of formula (1) and one or more monomers of formula (2) as described above, one or more cure catalysts, one or more organic solvents, and any optional components. The weight ratio of the silicon-containing polymers to the organic blend polymers is preferably from 95:5 to 50:50, and more preferably from 80:20 to 60:40.

When the compositions of the invention are used as underlayers, it is preferred that one or more of the polymers in the composition comprise one or more chromophore moieties. Preferably, one or more of the silicon-containing polymers of the invention, one or more of the optional blend polymers, one or more of any optional secondary polymers, or any combination of these has a chromophore moiety, and more preferably one or more of the silicon-containing polymers of the invention or one or more of the organic blend polymers of the invention has a chromophore. It is more preferred that at least one silicon-containing polymers of the invention has one or more chromophores. Suitable chromophores are aryl moieties, substituted aryl moieties, aralkyl moieties or aralkenyl moieties, such as $C_{6-20}$ aryl, substituted $C_{6-20}$ aryl, $C_{6-20}$ aralkyl, and $C_{8-30}$ aralkenyl. Exemplary chromophore moieties include, without limitation, phenyl, naphthyl, anthracenyl, phenanthryl, benzyl, phenethyl, tolyl, xylyl, styrenyl, vinylnaphthalene, vinylanthracene, dibenzothiophene, thioxanthone, carbazole, indole, acridine, and the like, and preferably phenyl, naphthyl, anthracenyl, phenanthryl, benzyl, and the like. The choice of such chromophore depends upon the antireflective properties desired and is within the ability of those skilled in the art.

The present compositions may be coated on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15 to 90 seconds to obtain a desired layer of the silicon-containing polymer on the substrate. Such silicon-containing polymer layer also comprises both the silicon-containing polymer comprising a backbone comprising Si—O linkages and the organic blend polymer comprising as polymerized units one or more monomers of formula (1) and one or more monomers of formula (2) as described above. It will be appreciated by those skilled in the art that the thickness of the polymer mixture layer may be adjusted by changing the spin speed, as well as the solids content of the composition.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being batch fabricated.

After being coated on the substrate, the silicon-containing polymer layer, which comprises both the silicon-containing polymer comprising a backbone comprising Si—O linkages; one or more organic blend polymers as described above, is optionally soft-baked at a relatively low temperature to remove any solvent and other relatively volatile components from the underlayer. Typically, the substrate is baked at a temperature of ≤200° C., preferably from 100 to 200° C., and more preferably from 100 to 150° C. The baking time is typically from 10 seconds to 10 minutes, preferably from 30 seconds to 5 minutes, and more preferably from 60 to 90 seconds. When the substrate is a wafer, such baking step may be performed by heating the wafer on a hot plate. Such soft-baking step may be performed as part of the curing of the silicon-containing polymer, or may be omitted altogether.

The silicon-containing polymer layer is then cured to form a siloxane underlayer. The silicon-containing polymer is sufficiently cured such that the film does not intermix with a subsequently applied organic layer, such as a photoresist or other organic layer disposed directly on the siloxane underlayer, while still maintaining the desired antireflective properties (n and k values) and etch selectivity of the siloxane underlayer film. The silicon-containing polymer layer may be cured in an oxygen-containing atmosphere, such as air, or in an inert atmosphere, such as nitrogen and under conditions, such as heating, sufficient to provide a cured siloxane underlayer. This curing step is conducted preferably on a hot plate-style apparatus, although oven curing may be used to obtain equivalent results. Typically, such curing is performed by heating the silicon-containing polymer layer at a curing temperature of ≤350° C., and preferably 200 to 250° C. Alternatively, a two-step curing process or a ramped temperature curing process may be used. Such two-step and ramped temperature curing conditions are well-known to those skilled in the art. The curing temperature selected should be sufficient for any thermal acid generator used to liberate acid to aid in curing of the silicon-containing polymer film. The curing time may be from 10 seconds to 10 minutes, preferably from 30 seconds to 5 minutes, more preferably from 45 seconds to 5 minutes, and yet more preferably from 45 to 90 seconds. The choice of final curing temperature depends mainly upon the desired curing rate, with higher curing temperatures requiring shorter curing times. Following this curing step, the siloxane underlayer surface may optionally be passivated by treatment with a passivating agent such as a disilazane compound, such as hexamethyldisilazane, or by a dehydration bake step to remove any adsorbed water. Such passivating treatment with a disilazane compound is typically performed at 120° C.

After curing of the silicon-containing polymer layer to form a siloxane underlayer, one or more processing layers, such as photoresists, hardmask layers, bottom antireflective coating (or BARC) layers, and the like, may be disposed on the siloxane underlayer. For example, a photoresist layer may be disposed, such as by spin coating, directly on the surface of the siloxane underlayer. Alternatively, a BARC layer may be coated directly on the siloxane underlayer, followed by curing of the BARC layer, and coating a photoresist layer directly on the cured BARC layer. In another alternative, an organic underlayer is first coated on a substrate and cured, a silicon-containing polymer layer of the invention is then coated on the cured organic underlayer, the silicon-containing polymer layer is then cured to form a siloxane underlayer, an optional BARC layer may be coated directly on the siloxane underlayer, followed by curing of the optional BARC layer, and coating a photoresist layer directly on the cured BARC layer. A wide variety of photoresists may be suitably used, such as those used in 193 nm lithography, such as those sold under the EPic™ brand available from Dow Electronic Materials (Marlborough, Mass.). Suitable photoresists may be either positive tone development or negative tone development resists, or may be conventional negative resists. The photoresist layer is then imaged (exposed) using patterned actinic radiation, and the exposed photoresist layer is then developed using the appropriate developer to provide a patterned photoresist layer. The pattern is next transferred from the photoresist layer to any optional BARC layer, and then to the siloxane underlayer by an appropriate etching technique, such as dry etching with an appropriate plasma. Typically, the photoresist is also removed during such etching step. Next, the pattern is transferred to any organic underlayer present using an appropriate technique, such as dry etching with $O_2$ plasma, and then to the substrate as appropriate. Following these pattern transfer steps, the siloxane underlayer, and any optional organic underlayers are removed using conventional techniques. The electronic device substrate is then further processed according to conventional means.

The present compositions provide siloxane underlayers having good etch resistance and high silicon content (≤45% Si, and preferably from 20 to 30% Si). The silicon-containing polymer layers and siloxane underlayers described herein are wet strippable. By "wet strippable" is meant that the silicon-containing polymer layers and siloxane underlayers of the invention are substantially removed (≥95% of film thickness) by contacting the polymer layer or siloxane underlayer with conventional wet stripping compositions, such as (1) an aqueous base composition, such as aqueous alkali (typically about 5%) or aqueous tetramethylammonium hydroxide (typically ≥5 wt %), (2) aqueous fluoride ion strippers such as ammonium fluoride/ammonium bifluoride mixtures, (3) a mixture of sulfuric acid and hydrogen peroxide, or (4) a mixture of ammonia and hydrogen peroxide. A particular advantage of the present polymers, and particularly of the present siloxane underlayers, is that they are wet strippable upon contact with a mixture of ammonia and hydrogen peroxide. A suitable mixture of sulfuric acid and hydrogen peroxide is concentrated sulfuric acid+30% hydrogen peroxide. A suitable mixture of ammonia and hydrogen peroxide is a mixture of ammonia+hydrogen peroxide+water in a weight ratio of 1:1:5 or 1:1:10 or 1:5:40 or 1:1:40. Preferably, ≥97%, and more preferably ≥99%, of the film thickness of the polymer layer or siloxane underlayer is removed by contacting the polymer layer or siloxane underlayer with either (i) mixture of sulfuric acid and hydrogen peroxide or (ii) a mixture of ammonium hydroxide and hydrogen peroxide. Another advantage of the present polymer layers is that they are easily removed to allow re-work of the substrate, such as a wafer. In such a re-work process, a composition described above comprising one or more silicon-containing polymers of the invention and one or more organic blend polymers of the invention is coated on a substrate. The coated polymer layer is then optionally soft-baked, and then cured to form a siloxane underlayer. Next, a photoresist layer is coated on the siloxane underlayer, and the resist layer is imaged and developed. The patterned resist layer and the siloxane underlayer may then each be removed to allow the wafer to be re-worked. The siloxane underlayer is contacted with any of the above-described wet stripping compositions, such as aqueous tetramethylammonium hydroxide compositions (typically ≥5 wt %) and aqueous fluoride ion strippers such as ammonium fluoride/ammonium bifluoride mixtures, at a suitable temperature to remove the siloxane underlayer to provide the substrate free, or substantially free, of siloxane underlayer and readily undergo additional re-work as may be necessary. Such re-work includes coating another layer of the present siloxane polymers on the substrate and processing the siloxane polymer coating as described above.

SYNTHESIS EXAMPLE 1: PREPARATION OF SILICON POLYMER 1

Hydrochloric acid (6.15 g of 12.1N) in water (156 g) was added to a mixture of methyltrimethoxysilane (99.80 g), phenyltrimethoxysilane (50.41 g), vinyltrimethoxysilane (62.75 g) and tetraethyl orthosilicate (294 g) and 2-propanol (467 g) over 10 minutes. The reaction mixture was stirred at room temperature for 1 hr., heated to reflux for 24 hr. and cooled to room temperature. The solution was diluted with PGEE (800 g) and low boiling reaction mixture components were removed under reduced pressure. The resulting solution was diluted with PGEE to afford a final 10 wt % solution of Silicon Polymer 1 ($M_w$=9000 Da).

SYNTHESIS EXAMPLE 2: PREPARATION OF SILICON POLYMER 2

Acetic acid (35.5 g) in water (160 g) was added to a mixture of methyltrimethoxysilane (99.8 g), phenyltrimethoxysilane (50.4 g), vinyltrimethoxysilane (62.8 g) and tetraethyl orthosilicate (294 g) and PGMEA (467 g) over 10 min. The reaction mixture was stirred at room temperature for 1 hr., heated to 85° C. for 6 hr. and then cooled to room temperature. Low boiling reaction mixture components were removed under reduced pressure and the resulting solution was diluted with PGMEA to afford a final solution of Silicon Polymer 2 (ca. 10-12 wt %) ($M_w$=4000 Da).

SYNTHESIS EXAMPLE 3: PREPARATION OF SILICON POLYMER 3

H Hydrochloric acid (0.265 g of 12.1N) in water (29.4 g) was added to a mixture of vinyltrimethoxysilane (4.75 g), phenyltrimethoxysilane (12.7 g), bis(triethoxysilyl)ethylene (83.5 g) and 2-propanol (160 g) over 10 min. The reaction mixture was stirred at room temperature for 1 hr., heated to reflux for 18 hr. and then cooled to room temperature. The solution was diluted with PGEE (300 g) and low boiling reaction mixture components were removed under reduced pressure. The resulting solution of Silicon Polymer 3 was diluted with PGEE to afford a final concentration of 10 wt % ($M_w$=28000 Da).

SYNTHESIS EXAMPLE 4: PREPARATION OF SILICON POLYMER 4

Hydrochloric acid (6.15 g of 12.1N) in water (225 g) was added to a mixture of 3-(3-(triethoxysilyl)propyl)dihydrofuran-2,5-dione (223 g), phenyltrimethoxysilane (50.41 g), vinyltrimethoxysilane (62.75 g) and tetraethyl orthosilicate (294 g) and 2-propanol (467 g) over 10 min. The reaction mixture was stirred at room temperature for 1 hr., heated to reflux for 24 hr. and then cooled to room temperature. The solution was diluted with PGEE (800 g) and low boiling reaction mixture components were removed under reduced pressure. The resulting solution was diluted with PGEE to afford a final 10 wt % solution of Silicon Polymer 4 ($M_w$=3900 Da).

SYNTHESIS EXAMPLE 5: PREPARATION OF SILICON POLYMER 5

Hydrochloric acid (0.615 g of 12.1N) in water (15.6 g) was added to a mixture of (triethoxysilyl)methyl acetate (17.3 g), phenyltrimethoxysilane (5.04 g), vinyltrimethoxysilane (6.28 g), tetraethyl orthosilicate (29.4 g) and 2-propanol (46.7 g) over 10 min. The reaction mixture was stirred at room temperature for 1 hr., heated to reflux for 24 hr. and cooled to room temperature. The solution was diluted with PGEE (80 g) and low boiling reaction mixture components were removed under reduced pressure. The resulting solution was diluted with PGEE to afford a final 10 wt % solution of Silicon Polymer 5 ($M_w$=8500 Da).

SYNTHESIS EXAMPLE 6: PREPARATION OF SILICON POLYMER 6

Hydrochloric acid (0.615 g of 12.1N) in water (15.6 g) was added to a mixture of (triethoxysilyl)methyl acetate (17.3 g), phenyltrimethoxysilane (5.04 g), vinyltrimethoxysilane (6.28 g) tetraethyl orthosilicate (29.4 g), propoxylated pentaerythritol (3.60 g) and 2-propanol (46.7 g) over 10 min. The reaction mixture was stirred at room temperature for 1 hr., heated to reflux for 24 hr. and cooled to room temperature. The solution was diluted with PGEE (80 g) and low boiling reaction mixture components were removed under reduced pressure. The resulting solution was diluted with PGEE to afford a final 10 wt % solution of Silicon Polymer 6 ($M_w$=4100 Da).

SYNTHESIS EXAMPLE 7: PREPARATION OF SILICON POLYMER 7

Hydrochloric acid (0.615 g of 12.1N) in water (15.6 g) was added to a mixture of tert-butyl 2-methyl-3-(triisopropoxysilyl)-propanoate (14.7 g), (4-(3-(diethoxy(methyl)silyl)propoxy)-2-hydroxyphenyl)(phenyl)methanone (10.9 g), tetraethyl orthosilicate (29.4 g), and 2-propanol (46.7 g) over 10 min. The reaction mixture was stirred at room temperature for 1 hr., heated to reflux for 24 hr. and cooled to room temperature. The solution was diluted with PGEE (80 g) and low boiling reaction mixture components were removed under reduced pressure. The resulting solution was diluted with PGEE to afford a final 10 wt % solution of Silicon Polymer 7 ($M_w$=4600 Da).

SYNTHESIS EXAMPLE 8: PREPARATION OF ORGANIC POLYMER 1

A solution of 2-hydroxyethyl methacrylate (HEMA), (3.34 g) gamma butyrolactone (GBLMA), (4.37 g) tert-butylmethacrylate (tBMA), (3.65 g) and methacrylic acid (2.21 g) dissolved in 1,3-dioxolane (11.5 g) and a solution of V-65 initiator (2.55 g) dissolved in 2:1 v/v tetrahydrofurane/acetonitrile (2.55 g) were both added dropwise over 2 hr. to 3-dioxolane (26.7 g) at 75° C. under a nitrogen blanket. After addition, the reaction solution was held at 75° C. for an additional 2 hr., cooled to room temperature, diluted with 15 g THF and isolated by drop-wise addition into 500 mL of stirred di-diopropylether. The precipitated polymer was collected by vacuum filtration and vacuum oven dried for 24 hr. to afford Organic Polymer 1 as a white solid (10.2 g, 75%). $M_w$ was determined to be 4000 Da.

SYNTHESIS EXAMPLES 9-24

Organic Polymers 2 to 4 and 6 to 17, reported in Table 2 below, were synthesized according to Synthesis Example 8 above using the monomers listed in Table 1 below. Organic Polymers 2 to 4 and 6 to 17 were isolated in 50-99% yield and had a $M_w$ between 3500-3800 Da. Organic Polymer 5 was a commercially available polymer from DuPont.

TABLE 1

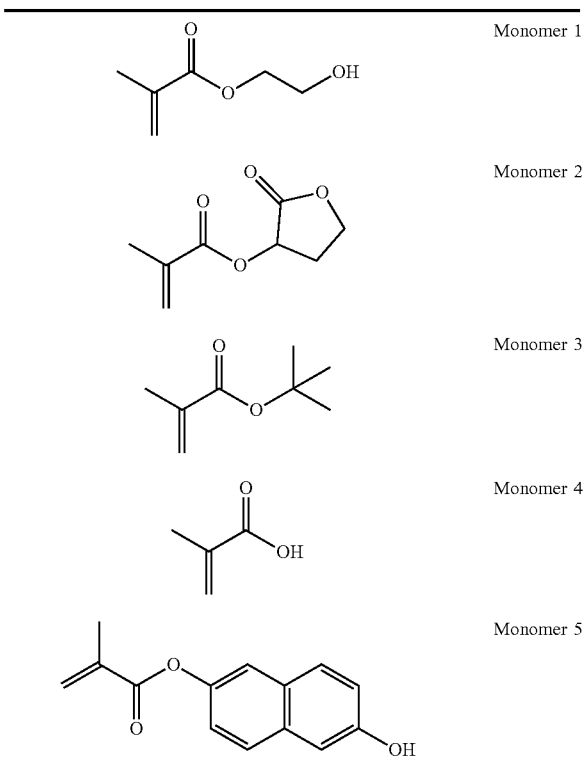

TABLE 1-continued

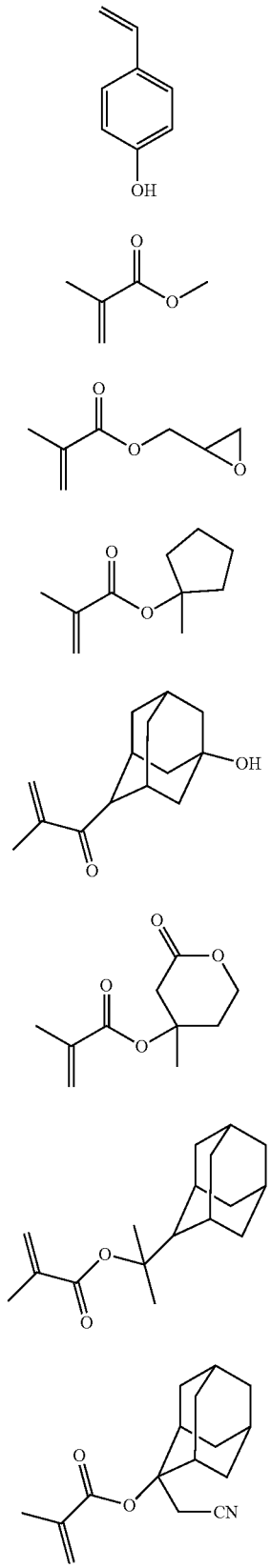

Monomer 6

Monomer 7

Monomer 8

Monomer 9

Monomer 10

Monomer 11

Monomer 12

Monomer 13

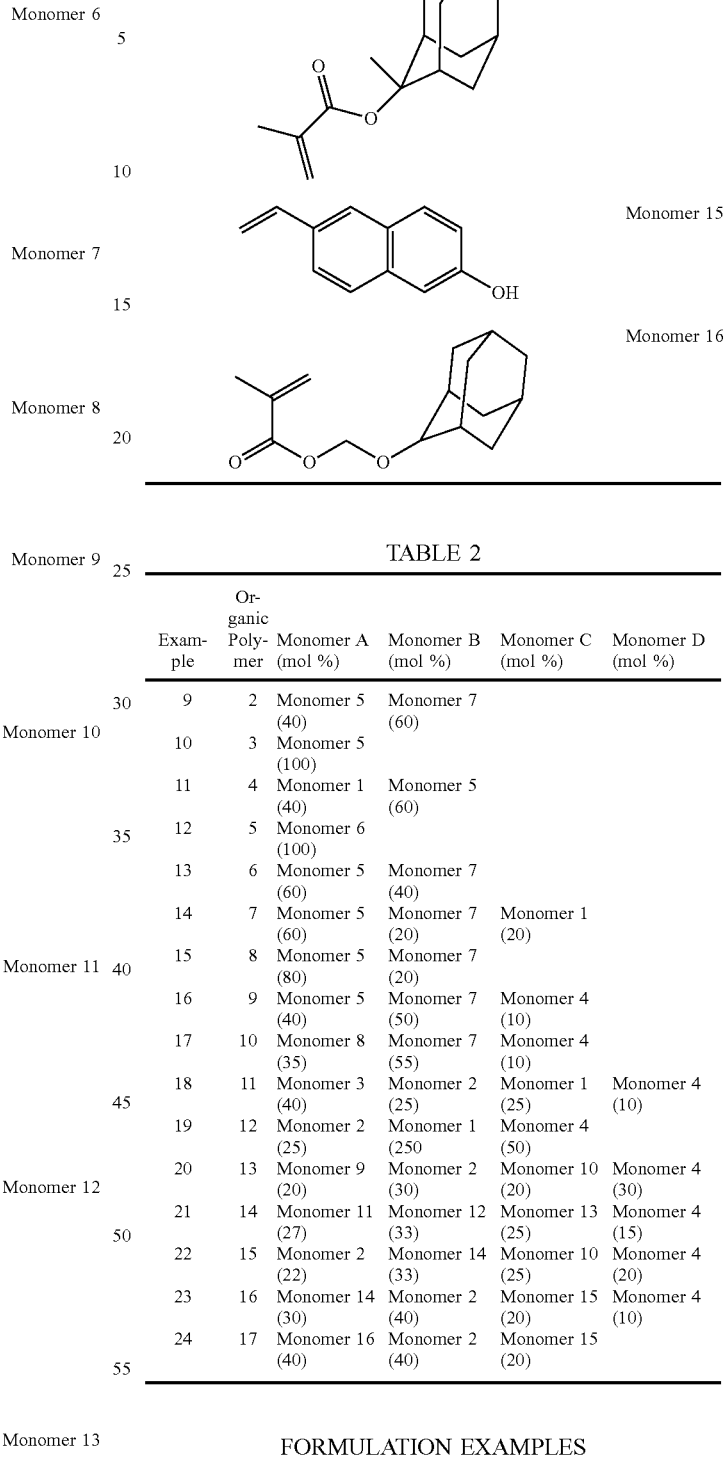

Monomer 14

Monomer 15

Monomer 16

TABLE 2

| Example | Organic Polymer | Monomer A (mol %) | Monomer B (mol %) | Monomer C (mol %) | Monomer D (mol %) |
|---|---|---|---|---|---|
| 9 | 2 | Monomer 5 (40) | Monomer 7 (60) | | |
| 10 | 3 | Monomer 5 (100) | | | |
| 11 | 4 | Monomer 1 (40) | Monomer 5 (60) | | |
| 12 | 5 | Monomer 6 (100) | | | |
| 13 | 6 | Monomer 5 (60) | Monomer 7 (40) | | |
| 14 | 7 | Monomer 5 (60) | Monomer 7 (20) | Monomer 1 (20) | |
| 15 | 8 | Monomer 5 (80) | Monomer 7 (20) | | |
| 16 | 9 | Monomer 5 (40) | Monomer 7 (50) | Monomer 4 (10) | |
| 17 | 10 | Monomer 8 (35) | Monomer 7 (55) | Monomer 4 (10) | |
| 18 | 11 | Monomer 3 (40) | Monomer 2 (25) | Monomer 1 (25) | Monomer 4 (10) |
| 19 | 12 | Monomer 2 (25) | Monomer 1 (250) | Monomer 4 (50) | |
| 20 | 13 | Monomer 9 (20) | Monomer 2 (30) | Monomer 10 (20) | Monomer 4 (30) |
| 21 | 14 | Monomer 11 (27) | Monomer 12 (33) | Monomer 13 (25) | Monomer 4 (15) |
| 22 | 15 | Monomer 2 (22) | Monomer 14 (33) | Monomer 10 (25) | Monomer 4 (20) |
| 23 | 16 | Monomer 14 (30) | Monomer 2 (40) | Monomer 15 (20) | Monomer 4 (10) |
| 24 | 17 | Monomer 16 (40) | Monomer 2 (40) | Monomer 15 (20) | |

FORMULATION EXAMPLES

Formulations 1-30 and Comparative Formulations C1-C6 were prepared by combining the amount of each of the following components described in Table 3. The Silicon Polymer Solutions, Organic Polymer Solutions, and catalysts used are described in Table 4. In Table 3, "Organic Polymer/OPS" refers to the Organic Polymers of the invention from Examples 8 to 24 and to the particular Organic Polymer Solutions (OPS) from Table 4 made using the specified Organic Polymer. Where no OPS is indicated used, the specified weight is the weight of dry Organic Polymer added. Where an OPS is indicated, the weight is the weight of the OPS added.

TABLE 3

| Formulation | Silicon Polymer Solution (g) | Organic Polymer/ OPS (g) | Catalyst (g) | Solvent (g) |
|---|---|---|---|---|
| 1 | B (1.26) | Polymer 2 (0.14) | 3 (0.284) | PGMEA (14.8)/ EL (0.60) |
| 2 | B (1.76) | Polymer 2 (0.47) | 3 (0.284) | PGMEA (14.3)/ EL (0.60) |
| 3 | B (1.26) | Polymer 3/ (0.14) | 3 (0.284) | PGMEA (14.8)/ EL (0.60) |
| 4 | B (1.76) | Polymer 3 (0.09) | 3 (0.284) | PGMEA (14.3)/ EL (0.60) |
| 5 | B (1.26) | Polymer 4 (0.14) | 3 (0.284) | PGMEA (14.8)/ EL (0.60) |
| 6 | B (1.76) | Polymer 4 (0.09) | 3 (0.284) | PGMEA (14.3)/ EL (0.60) |
| 7 | C (1.27) | Polymer 5/ OPS2 (1.44) | 3 (0.288) | PGMEA (13.4)/ EL (0.60) |
| 8 | C (2.47) | Polymer 6/ OPS2 (0.48) | 3 (0.400) | PGMEA (16.3)/ EL (3.29) |
| 9 | C (2.47) | Polymer 7/ OPS2 ( ).48) | 3 (0.400) | PGMEA (16.3)/ EL (3.29) |
| 10 | C (2.47) | Polymer 8/ OPS2 (0.48) | 3 (0.400) | PGMEA (16.3)/ EL (3.29) |
| 11 | C (1.78) | Polymer 9/ OPS1 (0.43) | 3 (0.288) | PGMEA (12.1)/ EL (2.37) |
| 12 | C (1.28) | Polymer 9/ OPS1 (0.719) | 3 (0.288) | PGMEA (12.1)/ EL (2.37) |
| 13 | C (1.78) | Polymer 10/ OPS1 (0.43) | 3 (0.288) | PGMEA (12.1)/ EL (2.37) |
| 14 | C (1.28) | Polymer 10/ OPS1 (0.72) | 3 (0.288) | PGMEA (12.1)/ EL (2.37) |
| 15 | D (8.31) | Polymer 1/ OPS6 (3.56) | 4 (0.320) | PGEE (32.0)/ HBM (40.8) |
| 16 | D (8.31) | Polymer 10/ OPS6 (3.56) | 4 (0.320) | PGEE (32.0)/ HBM (40.8) |
| 17 | E (1.66) | Polymer 1/ OPS6 (0.71) | 1 (0.640) | PGEE (32.0)/ HBM (8.23) |
| 18 | A (19.8) | Polymer 1/ OPS4 (19.8) | 4 (1.07) | PGEE (67.9)/ EL (19.0) |
| 19 | A (15.80) | Polymer 1/ OPS4 (23.8) | 4 (1.07) | PGEE (71.4)/ EL (75.4) |
| 20 | A (13.9) | Polymer 1/ OPS4 (25.7) | 4 (1.07) | PGEE (3.2)/ EL (73.7) |
| 21 | F (2.88) | Polymer 12/ OPS6 (1.02) | 1 (0.914) | PGEE (4.54)/ EL (7.9) |
| 22 | F (2.38) | Polymer 1/ OPS6 (1.02) | 1 (0.914) | PGEE (4.54)/ EL (7.9) |
| 23 | G (2.38) | Polymer 1/ OPS6 (1.02) | 1 (0.914) | PGEE (4.54)/ EL (7.9) |
| 24 | H (2.88) | Polymer 1/ OPS6 (0.87) | 1 (0.777) | PGEE (4.33)/ HBM (8.85) |
| 25 | A (1.44) | Polymer 13/ OPS6 (1.44) | 1 (0.777) | PGEE (5.62)/ HBM (7.55) |
| 26 | A (1.44) | Polymer 14/ OPS6 (1.44) | 1 (0.777) | PGEE (5.62)/ HBM (7.55) |
| 27 | A (1.44) | Polymer 15/ OPS6 (1.44) | 1 (0.777) | PGEE (5.62)/ HBM (7.55) |
| 28 | A (1.44) | Polymer 16/ OPS6 (1.44) | 1 (0.777) | PGEE (5.62)/ HBM (7.55) |
| 29 | A (1.44) | Polymer 17/ OPS6 (1.44) | 1 (0.777) | PGEE (5.62)/ HBM (7.55) |
| 30 | I (2.88) | Polymer 1/ OPS6 (2.02) | 1 (0.777) | PGEE (4.33)/ HBM (8.85) |
| C1 | A (2.38) | — | 1 (0.64) | PGEE (5.66)/ EL (8.24) |
| C2 | E (2.38) | — | 1 (0.64) | PGEE (5.02)/ HBM (8.87) |
| C3 | F (2.88) | — | 1 (0.78) | PGEE (4.33)/ EL (8.84) |
| C4 | G (2.88) | — | 1 (0.78) | PGEE (4.33)/ HBM (8.85) |
| C5 | H (2.88) | — | 1 (0.78) | PGEE (4.33)/ HBM (8.85) |
| C6 | I (2.88) | — | 1 (0.78) | PGEE (4.33)/ HBM (8.85) |

TABLE 4

| Component | Description |
|---|---|
| Silicon Polymer Solution A | Silicon Polymer 1 (10 wt %) in PGEE |
| Silicon Polymer Solution B | Silicon Polymer 2 (11.3 wt %) in PGMEA |
| Silicon Polymer Solution C | Silicon Polymer 2 (10.8 wt %) in PGMEA |
| Silicon Polymer Solution D | Silicon Polymer 1 (11.3 wt %) in PGEE |
| Silicon Polymer Solution E | Silicon Polymer 3 (10 wt %) in PGEE |
| Silicon Polymer Solution F | Silicon Polymer 4 (10 wt %) in PGEE |
| Silicon Polymer Solution G | Silicon Polymer 5 (10 wt %) in PGEE |
| Silicon Polymer Solution H | Silicon Polymer 6 (10 wt %) in PGEE |
| Silicon Polymer Solution I | Silicon Polymer 7 (10 wt %) in PGEE |
| OPS1 | 20 wt % of any of Organic Polymers 1-17 in PGMEA |
| OPS2 | 10 wt % of any of Organic Polymers 1-17 in PGMEA |
| OPS3 | 5 wt % of any of Organic Polymers 1-17 in PGMEA |
| OPS4 | 10 wt % of any of Organic Polymers 1-17 in EL |
| OPS5 | 10 wt % of any of Organic Polymers 1-17 in HBM |
| OPS6 | 10 wt % of any of Organic Polymers 1-17 in PGEE |
| Catalyst 1 | 0.1 wt % of tetrabutylammonium chloride in PGEE |
| Catalyst 2 | 0.1 wt % of tetramethylammonium chloride in PGMEA |
| Catalyst 3 | 0.1 wt % of tetramethylammonium chloride in EL |
| Catalyst 4 | 1 wt % of tetrabutylammonium chloride in PGEE |

Wet Strippability. Formulation samples tested were filtered through 0.2 µm polytetrafluoroethylene syringe and were spin-coated on bare 200 mm silicon wafers at 1500 rpm and baked at 240° C. for 60 sec. using an ACT-8 Clean Track (Tokyo Electron Co.). Film thickness after baking of each coated film was measured with an OptiProbe™ instrument from Therma-wave Co. The coated sample was then evaluated for SC-1 wet strippability using a mixture of 30% NH$_4$OH/30% H$_2$O$_2$/water in a w/w/w ratio of 1/1/5, 1/5/40, or 1/1/40. The SC-1 mixture was heated to 70° C. Coupons of each coated wafer were immersed into the stripping solution for 5 min. The coupons were removed from the SC-1 mixture and rinsed with deionized water. The film thickness loss for each sample was calculated as the difference in film thickness before and after contact with the SC-1 stripping mixture. A separate film prepared as described above is optionally tested for SC-1 strippability after etching. Etching was performed for 60 sec. using RIE790 from Plasma-Therm Co. with oxygen gas, 25 sscm flow, 180 W of power, and 6 mTorr of pressure.

The data for a stripping mixture of 30% NH$_4$OH/30% H$_2$O$_2$/water in a 1/1/5 w/w/w ratio are reported in Table 5 versus Comparative Formulation C1, in Table 6 for a 1/5/40 w/w/w ratio versus Comparative Formulation C1, in Table 7 for a 1/5/40 w/w/w ratio versus Comparative Formulation C2, and in Table 8 for a 1/1/40 w/w/w ration versus Comparative Formulations C1 and C3-C6. Data labeled as 'No Etch' were calculated as a percentage by taking the difference in film thickness between the coated wafer and the film thickness after exposure to the SC-1 stripping mixture. Data labeled as 'After Etch' were calculated as a percentage by taking the difference in film thickness between the coated wafer after exposure to oxygen etch and the film thickness after the same wafer was exposed to the SC-1 stripping mixture.

In Tables 5 to 8, the stripping data for the respective Comparative Formulation were normalized to 1.00, and designated with "◇". Inventive examples that outperformed the Comparative Formulation by <2 times are designated with "■"; inventive examples that outperformed the Comparative Formulation by 2 to 10 times are designated with "□"; inventive examples that outperformed the Comparative Formulation by 10 to 30 times are designated with "∇"; and inventive examples that outperformed the Comparative Formulation by over 30 times are designated with "▲".

TABLE 5

| SC-1 1/1/5 w/w/w | | |
|---|---|---|
| Formulation | No Etch | After Etch |
| C1 | ◇ | ◇ |
| 1 | ▲ | □ |
| 2 | ∇ | □ |
| 3 | ▲ | □ |
| 4 | ▲ | □ |
| 5 | ▲ | □ |
| 6 | ▲ | □ |
| 7 | ▲ | □ |
| 8 | ∇ | □ |
| 9 | ▲ | □ |
| 10 | ▲ | □ |
| 11 | ▲ | □ |
| 12 | ▲ | □ |
| 13 | ▲ | □ |
| 14 | ▲ | □ |

TABLE 6

| SC-1 1/5/40 w/w/w | |
|---|---|
| Formulation | No Etch |
| C1 | ◇ |
| 15 | ▲ |
| 16 | ▲ |

TABLE 7

| SC-1 1/5/40 w/w/w | |
|---|---|
| Formulation | No Etch |
| C2 | ◇ |
| 17 | □ |

TABLE 8

| SC-1 1/1/40 w/w/w | | |
|---|---|---|
| Formulation | No Etch | After Etch |
| C1 | ◇ | ◇ |
| C3 | ◇ | ◇ |
| C4 | ◇ | ◇ |
| C5 | ◇ | ◇ |
| C6 | ◇ | ◇ |

TABLE 8-continued

| SC-1 1/1/40 w/w/w | | |
|---|---|---|
| Formulation | No Etch | After Etch |
| 20 | ▲[1] | ▲[1] |
| 21 | ▲[1] | ▲[1] |
| 22 | ▲[1] | ▲[1] |
| 24 | ▶[2],▲[1] | ▲[2] |
| 25 | ▶[2],▲[1] | ∇[2] |
| 27 | ■[3],▲[1] | ▲[3] |
| 29 | □[4] | □[4] |
| 30 | ▲[1] | ▲[1] |
| 31 | ▲[1] | ▲[1] |
| 32 | ∇[1] | ▲[1] |
| 33 | ▲[1] | ▲[1] |
| 34 | ■[1] | ▲[1] |
| 36 | ▲[5] | ∇[5] |

[1]Relative to C1.
[2]Relative to C3.
[3]Relative to C4.
[4]Relative to C5.
[5]Relative to C6.

The data in Tables 5-8 clearly show that the formulations of the invention improve the wet strippability of silicon-containing materials.

What is claimed is:

1. A process comprising: (a) coating a substrate with a coating composition comprising one or more curable silicon-containing polymers comprising a backbone comprising Si—O linkages, one or more organic blend polymers comprising as polymerized units one or more ethylenically unsaturated monomers having an acidic proton and having a pKa in water from −5 to 13, one or more organic solvents, and one or more quaternary ammonium salts as a cure catalyst to form a curable silicon-containing polymer layer on the substrate; (b) curing the silicon-containing polymer layer to form a siloxane underlayer, (c) disposing a layer of a photoresist on the siloxane underlayer, (d) pattern-wise exposing the photoresist layer to form a latent image; (e) developing the latent image to form a patterned photoresist layer having a relief image therein; (f) transferring the relief image to the siloxane underlayer plasma etching; and (g) removing the siloxane underlayer by contacting the siloxane underlayer with a wet stripping composition comprising a mixture of sulfuric acid and hydrogen peroxide or a mixture of ammonia and hydrogen peroxide; wherein the organic blend polymer comprises as polymerized units one or more monomers of formula (1) and one or more monomers of formula (2)

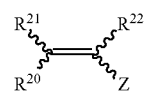

(1)

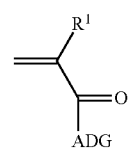

(2)

wherein Z is an organic residue having from 1 to 30 carbon atoms and an acidic proton having a pKa in water from −5 to 13: $R^{20}$ is chosen from H, $C_{1-10}$ alkyl, $C_{1-10}$ haloalkyl, halo, $C(=O)R^{24}$ and Z; each of $R^{21}$ and $R^{22}$ are independently chosen from H, $C_{1-4}$ alkyl, $C_{1-4}$ haloalkyl, halo, CN and Z; $R^{24}$ is independently chosen from $OR^{25}$ and $N(R^{26})_2$; $R^{25}$ is chosen from H, and $C_{1-20}$ alkyl; each $R^{26}$ is independently chosen from H, $C_{1-20}$ alkyl, and $C_{6-20}$ aryl; wherein Z and $R^{20}$ may be taken together to form a 5 to 7-membered unsaturated ring; ADG is an acid decomposable group; and $R^1$ is independently chosen from H, $C_{1-4}$ alkyl, $C_{1-4}$ haloalkyl, halo, and CN.

2. The process of claim 1 wherein the monomer of formula (2) has the formula (2a)

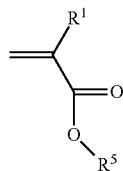

(2a)

wherein $R^5$ is chosen from a $C_{4-30}$ organic residue bound to the oxygen through a tertiary carbon or a $C_{4-30}$ organic residue comprising an acetal functional group; and $R^1$ is independently chosen from H, $C_{1-4}$ alkyl, $C_{1-4}$ haloalkyl, halo, and CN.

3. The process of claim 1 wherein the organic blend polymer further comprises as polymerized units one or more monomers of the formula (9)

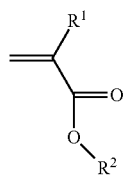

(9)

wherein $R^1$ is independently chosen from H, $C_{1-4}$ alkyl, $C_{1-4}$ haloalkyl, halo, and CN; and $R^2$ is a monovalent organic residue having a lactone moiety.

4. The process of claim 3 wherein the lactone moiety of $R^2$ is a 5 to 7-membered ring or a substituted 5 to 7-membered ring.

5. The process of claim 1 wherein the one or more silicon-containing polymers comprise as polymerized units one or more monomers chosen from formulae (3), (4), (5a), and (5b)

 (3)

 (4)

 (5a)

 (5b)

wherein each Y, $Y^1$ and $Y^2$ is independently a hydrolyzable moiety chosen from halo, $C_{1-10}$ alkoxy, and —O—C(O)—$R^4$; $R^3$ is $C_{1-30}$ hydrocarbyl moiety or substituted $C_{1-30}$ hydrocarbyl moiety; each $R^4$ is chosen from H, OH, $C_{1-10}$ alkyl, and $C_{1-10}$ alkoxy; and each $R^5$ is independently $C_{1-30}$ hydrocarbyl moiety or substituted $C_{1-30}$ hydrocarbyl moiety.

6. The process of claim 5 wherein the one or more silicon-containing polymers comprise as polymerized units one or more units of formula (6) and optionally one or more units of formula (7)

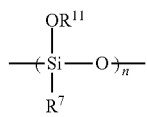

(6)

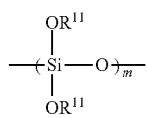

(7)

wherein each $R^6$ is independently chosen from $C_{1-30}$ hydrocarbyl moiety or substituted $C_{1-30}$ hydrocarbyl moiety; each $R^7$ is independently chosen from $C_{1-30}$ hydrocarbyl moiety, substituted $C_{1-30}$ hydrocarbyl moiety, and $OR^8$; each $R^8$ is chosen from H, $Si(R^9)_xO(R^{10})_y$, $C_{1-30}$ hydrocarbyl moiety, and substituted $C_{1-30}$ hydrocarbyl moiety; each $R^9$ is independently $C_{1-30}$ hydrocarbyl moiety or substituted $C_{1-30}$ hydrocarbyl moiety; each $R^{10}$ is independently H, $C_{1-10}$ alkyl or —C(O)—$C_{1-10}$ alkyl; each $R^{11}$ is independently chosen from H, $C_{1-10}$ alkyl, and —C(O)—$C_{1-10}$ alkyl; n refers to the number of repeat units of formula (6) in the polymer and is an integer from 1 to 100; m refers to the number of repeat units of formula (7) in the polymer and is an integer from 0 to 50; x=0 to 3; *y=0 to 3, and x+y=3.

7. The process of claim 1 further comprising coating a layer of a high carbon-content organic coating on the substrate prior to step (a).

8. A process comprising: (a) coating a substrate with a coating composition comprising one or more curable silicon-containing polymers comprising a backbone comprising Si—O linkages, one or more organic blend polymers comprising as polymerized units one or more ethylenically unsaturated monomers having an acidic proton and having a pKa in water from −5 to 13, one or more organic solvents, and one or more quaternary ammonium salts as a cure catalyst to form a curable silicon-containing polymer layer on the substrate; (b) curing the silicon-containing polymer layer to form a siloxane underlayer, (c) disposing a layer of a photoresist on the siloxane underlayer; (d) pattern-wise exposing the photoresist layer to form a latent image; (e) developing the latent image to form a patterned photoresist layer having a relief image therein; (f) transferring the relief image to the siloxane underlayer by plasma etching; and (g) removing the siloxane underlayer by contacting the siloxane underlayer with a wet stripping composition comprising a mixture of sulfuric acid and hydrogen peroxide or a mixture of ammonia and hydrogen peroxide; wherein the organic blend polymer comprises as polymerized units one or more monomers of formula (1) and one or more monomers of formula (9)

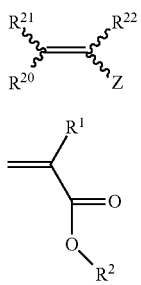

(1)

wherein Z is an organic residue having from 1 to 30 carbon atoms and an acidic proton having a pKa in water from −5 to 13; $R^{20}$ is chosen from H, $C_{1-10}$ alkyl, $C_{1-10}$ haloalkyl, halo, $C(=O)R^{24}$ and Z; each of $R^{21}$ and $R^{22}$ are independently chosen from H, $C_{1-4}$ alkyl, $C_{1-4}$ haloalkyl, halo, CN and Z; $R^{24}$ is independently chosen from $OR^2$ and $N(R^{26})_2$; $R^2$ is chosen from H, and $C_{1-20}$ alkyl; each $R^{26}$ is independently chosen from H, $C_{1-20}$ alkyl, and $C_{1-20}$ aryl; wherein Z and $R^{20}$ may be taken together to form a 5 to 7-membered unsaturated ring; $R^1$ is independently chosen from H, $C_{1-4}$ alkyl, $C_{1-4}$ haloalkyl, halo, and CN; and $R^2$ is a monovalent organic residue having a lactone moiety.

9. The process of claim 8 wherein the organic blend polymer further comprises as polymerized units one or more monomers of formula (2) ADG (2)

wherein ADG is an acid decomposable group; and $R^1$ is independently chosen from H, $C_{1-4}$ alkyl, $C_{1-4}$ haloalkyl, halo, and CN.

10. The process of claim 9 wherein the monomer of formula (2) has the formula (2a)

wherein $R^5$ is chosen from a $C_{4-30}$ organic residue bound to the oxygen through a tertiary carbon or a $C_{4-30}$ organic residue comprising an acetal functional group; and $R^1$ is independently chosen from H, $C_{1-4}$ alkyl, $C_{1-4}$ haloalkyl, halo, and CN.

* * * * *